United States Patent [19]

Futami

[11] Patent Number: 4,843,293

[45] Date of Patent: Jun. 27, 1989

[54] APPARATUS FOR CONTROLLING SERVO SYSTEM EMPLOYING PIEZO-ELECTRIC ACTUATOR

[75] Inventor: Shigeru Futami, 1-21-3NS-1-601, Ninomya, Yatabe-cho, Tsukuba-gun, Ibaraki 305, Japan

[73] Assignees: Research Development Corporation, Tokyo; Shigeru Futami, Ibaraki, both of Japan

[21] Appl. No.: 149,452

[22] Filed: Jan. 28, 1988

[30] Foreign Application Priority Data

Feb. 2, 1987 [JP] Japan ................................. 62-21976
Mar. 11, 1987 [JP] Japan ................................. 62-56065

[51] Int. Cl.$^4$ ............................................. G05D 11/36
[52] U.S. Cl. ..................................... 318/609; 318/610; 318/593; 318/640
[58] Field of Search ............... 318/609, 610, 593, 640; 250/442.1

[56] References Cited

U.S. PATENT DOCUMENTS

4,607,166 8/1986 Tamaki .............................. 250/442.1
4,749,928 6/1988 Dautiemay et al. ................. 318/610

Primary Examiner—William M. Shoop, Jr.
Assistant Examiner—Saul M. Bergmann
Attorney, Agent, or Firm—Armstrong, Nikaido, Marmelstein, Kubovcik & Murray

[57] ABSTRACT

A first servo system (31) which feeds back at least position and speed and a second servo system (32) which effects integral control by feeding back position are connected in series. A first signal obtained by multiplying the output of the integral controller of the second servo system by a first gain is added to the position feedback signal of the first servo system, while a second signal obtained by multiplying the input of the integral controller of the second servo system by a second gain is added to the speed feedback signal of the first servo system. In this way, feedback control is effected using one mutual position detector, thereby eliminating the dynamic interference between the first and second servo systems, and thus enabling the two servo systems to be activated simultaneously. Also, the position of a moving member having mass is controlled by controlling the voltage applied to a piezoelectric actuator using a device for detecting the position and acceleration of the moving member and a device for effecting control. The applied voltage E of the piezo-electric actuator is determined on the basis of a signal obtained by inputting a signal representative of the acceleration to a first-order lag circuit. a position command, and gain constants.

6 Claims, 10 Drawing Sheets

APPARATUS FOR CONTROLLING SERVO SYSTEM EMPLOYING PIEZO-ELECTRIC ACTUATOR

BACKGROUND OF THE INVENTION

The present invention relates to a double servo system for use in positioning and contouring control in which both high resolving power and high speed are demanded. More particularly, the present invention pertains to an apparatus for controlling a piezo-electric actuator servo system which may be suitably applied to a precision stage in semiconductor lithography equipment or machine tools such as a lathe and a machining center in which extremely tight geometrical tolerances are demanded.

The present invention also relates to an apparatus for controlling a position control system employing a piezo-electric actuator which may be used in the field which is generally known as super-precision machining, for example, positioning in lithography equipment used in the manufacture of semiconductors, super-precision machine tools for producing laser optical parts, precision and fast-response piston lathes, etc.

There has been proposed an arrangement wherein a servo system which has high resolving power and a small stroke, for example, one which employs a piezoelectric actuator, is connected in series to a conventional long-stroke servo system which employs a motor or the like to realize a double servo system which has a long stroke and high resolving power, and this proposed arrangement has begun to be put into practical use.

Figure 1A:
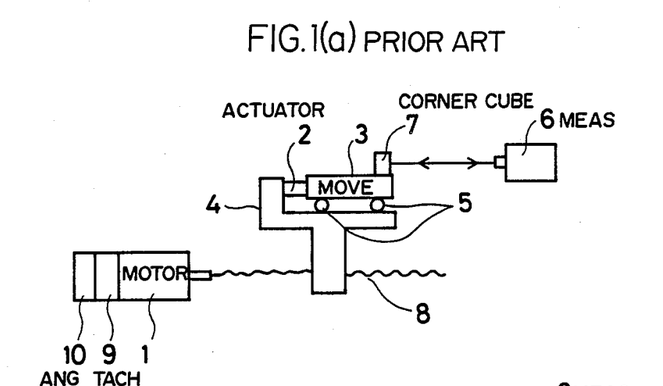
FIGS. 1a, 1b shows examples of the arrangement of a conventional double servo system.
Figure 1B:
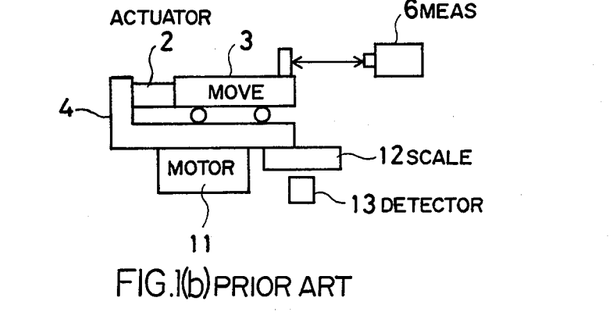

Referring to FIG. 1, the reference numeral 1 denotes a motor, 2 a piezo-electric actuator, 3 and 4 moving members, 5 a slide mechanism, 6 a laser distance measuring equipment, 7 a corner cube, 8 a ball screw, 9 a tachometer generator, 10 a rotational angle detector, 11 a linear motor, 12 a linear scale, and 13 a detecting head.

There has heretofore been a system arrangement, for example, one which is shown in FIG. 1, as a double servo system which is formed by series-connecting a first servo system which feeds back at least position and speed and a second servo system which performs integral control by feeding back position. The illustrated system arrangement is formed by connecting together the first moving member 4 and the second moving member 3 through the slide mechanism 5 (schematically shown in the figure). For example, as shown in FIG. 1(a), the ball screw 8 is activated by the motor 1 to control the position of the moving member 4, and the moving member 3 is then finely moved by driving the piezoelectric actuator 2, thus effecting precision position control. In the case of this double servo system, the motor 1 is feedback-controlled on the basis of a motor rotational speed $\dot{x}_M$ detected by the tachometer generator 9 and a motor rotational angle $x_M$ detected by the rotational angle detector 10, whereas the piezo-electric actuator 2 is feedback-controlled on the basis of the position x of the moving member 3 which is measured by a combination of the laser distance measuring equipment 6 and the corner cube 7. FIG. 1(b) shows a second example of the double servo system, in which the linear motor 11 is employed in place of the combination of the motor 1 and the ball screw 8 in the example shown in FIG. 1(a) and the combination of the linear scale 12 and the detecting head 13 is employed in place of the rotational angle detector 10 to measure the position $x_L$ of the moving member 4.

Figure 2:
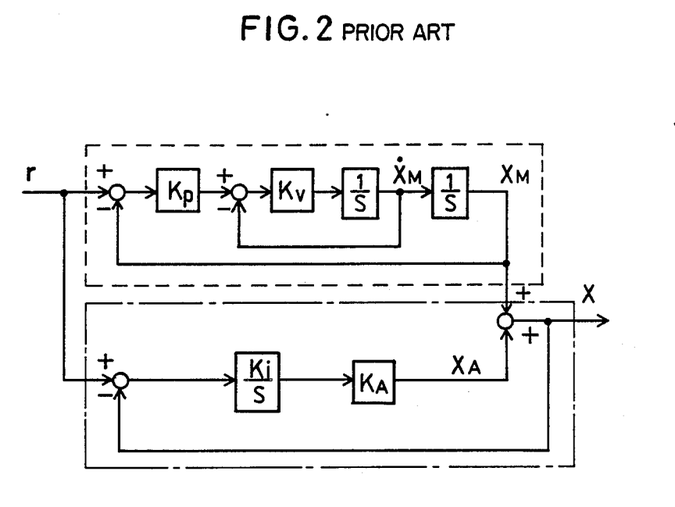
FIGS. 2 and 3 are block diagrams of control circuits used in the conventional double servo system.
Figure 3:
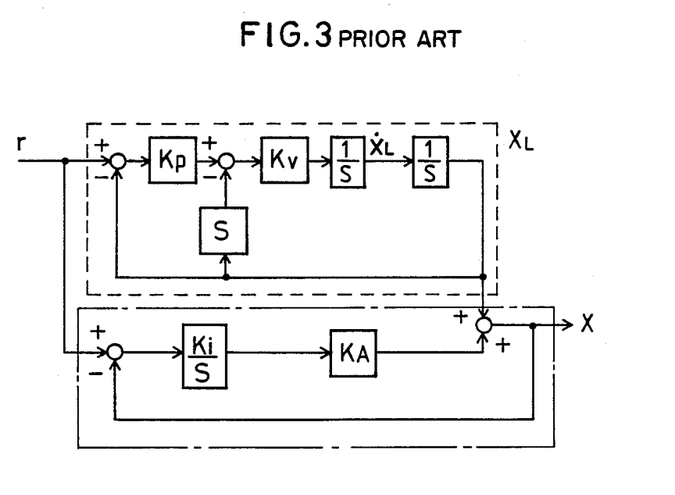

FIG. 2 is a block diagram showing the operation of the double servo system shown in FIG. 1(a), in which the portion surrounded with the chain line is the motor control system, while the portion surrounded with the one-dot chain line is the piezo-electric actuator control system. Since the piezo-electric actuator constitutes a proportionality system and has considerable hysteresis, it is general practice to subject the piezo-electric actuator to integral control, as illustrated. In this example, the piezo-electric actuator is feedback-controlled directly using a speed signal, whereas, in another example shown in FIG. 3, a circuit for obtaining the speed $\dot{x}_L$ from the position $x_L$ is additionally provided.

As a still another example of the conventional double servo system, there is a system (Moriyama et al.: Super-Precision X-Y Moving Table Equipped with Piezo-Electric Actuator Fine Adjustment Mechanism, Journal of the Japan society of Precision Engineering Vol. 50, No. 4, 1984) such as that shown in FIG. 4. This double servo system is also composed of a coarse adjustment servo system and a fine adjustment servo system which are connected in series. More specifically, a first moving table 25 is mounted on a base 24, and a second moving table 26 is connected to the upper side of the first moving table 25. The coarse adjustment servo system employs DC motors 21, 22 as actuators to control the position of the first moving table 25 in the directions of X and Y by feeding back speed and position, whereas the fine adjustment servo system employs a piezo-electric element 23 as an actuator to constitute an integral control system which feedback-controls the position of the second moving table 26.

Figure 4:
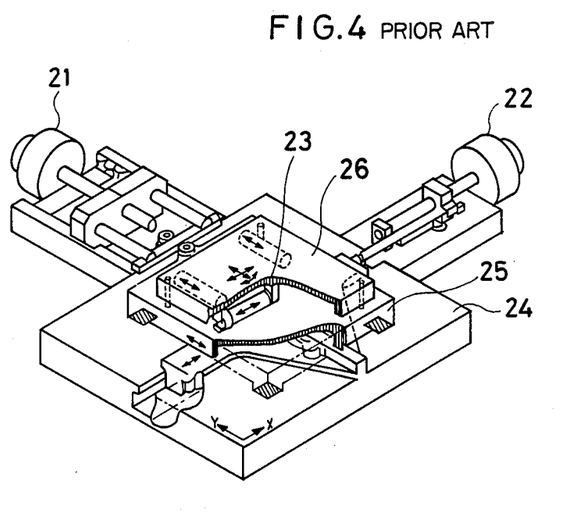
FIG. 4 shows another example of the arrangement of the conventional double, servo system.

In this double servo system, the fine adjustment servo system is activated after the completion of positioning effected by the coarse adjustment servo system. This is because, if the coarse and fine adjustment servo systems are activated simultaneously, the two servo systems dynamically interfere with each other, resulting in an incorrect operation, as described later.

In the foregoing double servo systems shown in FIG. 1, the motor control system and the piezo-electric actuator control system may be considered to be independent of each other and therefore the two control systems may be activated simultaneously. In such a case, however, the following problems arise. Namely, the system shown in FIG. 1(a) needs the rotational speed detector 9, the rotational angle detector 10 and the processing circuit associated therewith in addition to the position detector for the moving member 3, and the system shown in FIG. 1(b) also needs the linear scale 12, the detecting head 13 and the processing circuit associated therewith in addition to the position detector for the moving member 3. Accordingly, the production cost increases correspondingly and, at the same time, the installation space increases unfavorably.

The object of control in the double servo system is to make the position of the moving member 3 equal to a desired value, and therefore provision of a detector for detecting the position x of the moving member 3 must suffice theoretically. On the basis of this idea, the control system shown in FIG. 5 employs the position x in place of the position $x_L$ employed in the control system shown in FIG. 3, as control data which is fed back to the motor control system.

Figure 5:
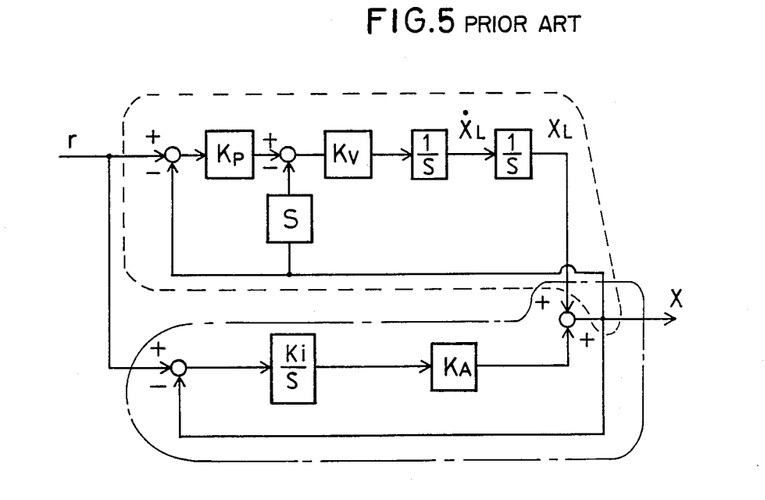
FIGS. 5 and 6 are views employed to describe problems experienced when feedback control is effected using a single position detector in the conventional double servo system.
Figure 6:
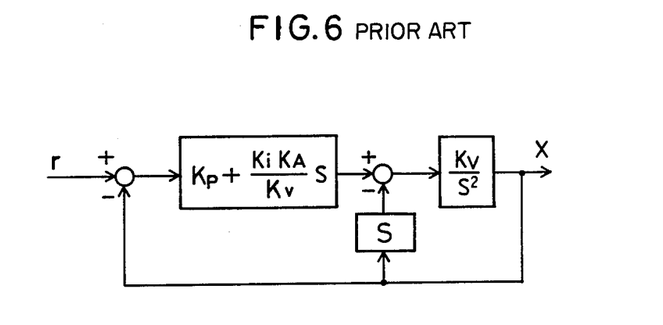

The control system shown in FIG. 5 suffers, however, from the problem that the desired operation cannot be achieved because of the interference between the motor control system and the piezo-electric actuator control system. The reason for this may be explained with reference to FIG. 6 which is a modification of the block diagram shown in FIG. 5. As will be clear from FIG. 6, if the motor control system is regarded as a fundamental control system, the piezo-electric actuator control system is equivalent to a position loop having a D (derivative) action added thereto. However, the D action is taboo in servo systems. In particular, in the servo system having a completely closed loop which is handled in this application, the oscillation characteristics of the mechanical vibrating system are involved in the control loop, and therefore the D action is harmful to stability. Accordingly, it is difficult to impart practical characteristics to the double servo system having the arrangement shown in FIG. 5. The reason why the motor control system and the piezo-electric actuator control system in the systems shown in FIG. 1 can operate without interfering with each other is that the two control systems are controlled by their respective position and speed detectors.

Due to the above-described reasons, it is also impossible to simultaneously activate the coarse and fine adjustment servo systems in the conventional double servo system shown in FIG. 4. Therefore, the double servo system shown in FIG. 4 has the following problems:

(1) The time required to switch over the two servo systems from the coarse adjustment to the fine adjustment leads to a corresponding increase in the positioning time. (2) The double servo system cannot be used for contouring control in which the two servo systems must be activated simultaneously.

Figure 7:
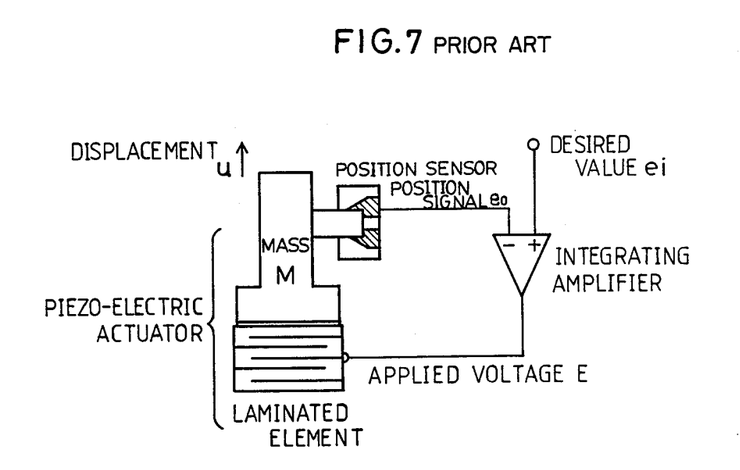
FIG. 7 shows a prior art in which a small displacement control system is realized as being a feedback control system.
Figure 8:
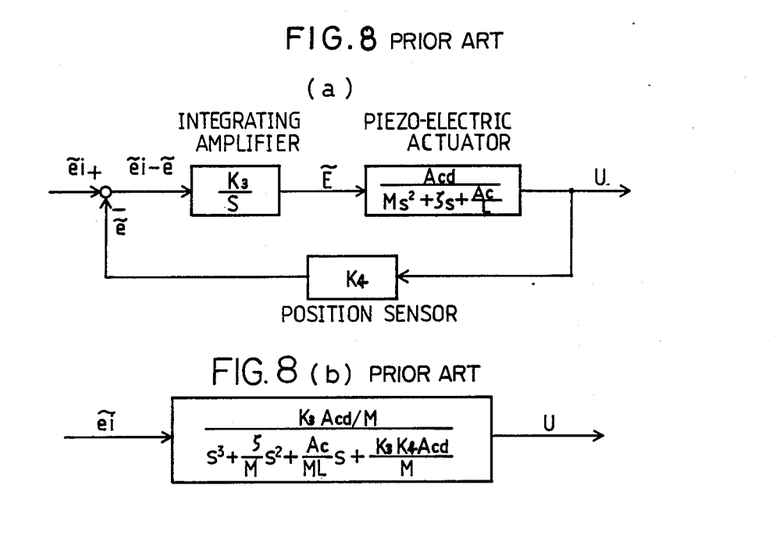
FIGS. 8a, 8b are block diagram of the feedback control system shown in FIG. 7.

FIG. 7 shows a conventional control system which realizes a small displacement control system by the use of a feedback control system (see FIGS. 6 and 17 in Uchino "Piezo-Electric/Electrostrictive Actuators", Morikita Shuppan, p. 123, 1985). In this feedback control system, the applied voltage E is given as being the integrated value of the difference between the desired value $e_i$ and the position signal $e_0$. Referring to FIG. 8, which is a block diagram of the feedback control system shown in FIG. 7, the block named the piezo-electric actuator shows the transfer function of the mechanical vibration system which consists of the actuator and mass. In the figure, $\xi$ is a parameter representative of the damping of the electrostrictive actuator.

Figure 9:
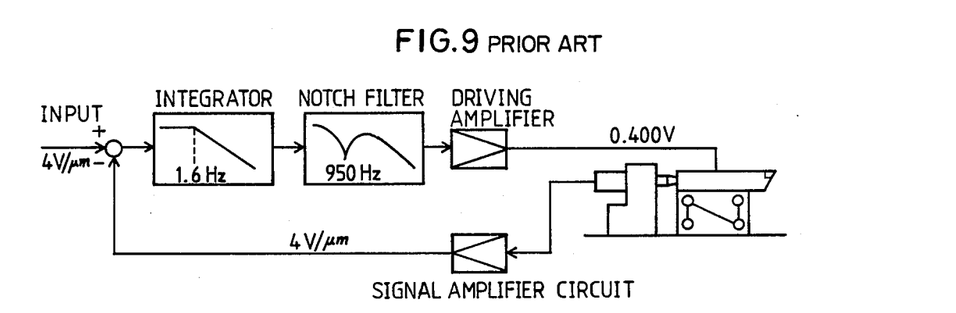
FIG. 9 shows an example of a small displacement tool rest which employs a piezo-electric element.

FIG. 9 shows a prior art of a small displacement slide rest using a piezo-electric element (see the article in Nikkei Mechanical, Sept. 22, 1986). In this feedback control system also, a piezo-electric actuator is subjected to closed-loop control, but the feature of this prior art resides in that a notch filter is inserted in order to lower the gain near the natural frequency of the mechanical vibration system and enhance the stability of the closed loop.

Figure 10:
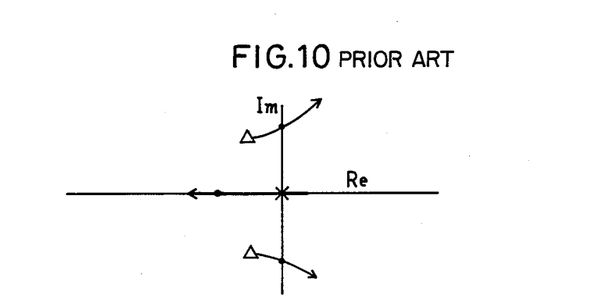
FIG. 10 shows the root locus of the feedback control system shown in FIG. 7.

In the conventional feedback control system shown in FIG. 7, however, the parameter $\xi$ that represents the damping of the electrostrictive actuator is considerably small in the case of ordinary elements, which results in a mechanical vibration system having inferior damping characteristics. FIG. 10 shows the results of examination of the response of the closed loop by a root locus plotted using the integral gain $K_3$ as a parameter.

As shown in FIG. 10, the root which starts from the pole (Δ) of the mechanicam vibration system becomes unstable as the gain $K_3$ increases, and it reaches the stability limit at the limit gain $K_{3c}$ (the pole at this time is represented by ●). Accordingly, in practice the gain $K_3$ must be set at a considerably smaller value than $K_{3c}$. Thus, in the conventional feedback control system shown in FIG. 7 it is impossible to set a large closed-loop gain in the case of a vibration system having inferior damping characteristics, and therefore this prior art suffers from the problems that the response of the closed loop is slow and the positioning accuracy cannot be increased.

In the feedback control system shown in FIG. 9, there is no problem of having the closed loop self-oscillating since the notch filter is inserted, but if the mechanical vibration system begins to oscillate at the natural frequency (the cut-off frequency of the notch filter) due to some reason, the notch filter does not work effectively at this frequency. Therefore, the oscillation must be damped only by the damping action of the mechanical vibration system itself, so that the oscillation continues for a disadvantageously long time. Further, the prior art shown in FIG. 9 suffers from the problem that the integrator may be offset in the low-frequency band since the gain does not reach infinity ($\infty$) when the frequency f is 0.

SUMMARY OF THE INVENTION

It is an object of the present invention to enable two control systems to be simultaneously activated with a single detector for detecting the position x of a moving member.

It is another object of the present invention to provide a system for controlling a piezo-electric actuator double servo system which enables two control systems to complement each other so as to obtain a desired response without interfering with each other.

It is a still another object of the present invention to stabilize a mechanical vibration system in a position control system employing a piezo-electric actuator, the mechanical vibration system consisting of the piezo-electric actuator as a spring system and a moving member a mass, by adding a control which enhances damping.

It is a further object of the present invention to quicken the response of a position control system, increase the degree of precision and also quickly damp oscillation which is externally generated, by setting the gain of the position control loop at a high level.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

To these ends, the present invention provides an apparatus for controlling a piezo-electric actuator double servo system in which a first servo system which feeds back at least position and speed and a second servo system which effects integral control by feeding back position are connected in series, wherein the improvement is characterized in that the two servo systems have a mutual feedback control system employing a single position detector and further characterized by comprising: ① a device for adding an output amplifier signal $\widetilde{x_4}$ obtained by multiplying the output of the integral controller of the second servo system by a gain of the amplifier $-k_1$ ($k_1>0$) to the position feedback signal of the first servo system; and ② a device for adding a speed of an actuator signal $x_A$ obtained by multiplying the input of the integral controller of the second servo system by a gain of a second amplifier $-k_2$ ($k_2>0$) to the speed feedback signal of the first servo system, whereby the dynamic interference between the first and second servo systems is eliminated and the two servo systems are activated simultaneously.

By virtue of the above-described arrangement, the displacement and speed of the piezo-electric actuator are approximately obtained from quantities of state inside the integral control system for the piezo-electric actuator and the feedback signals of the motor control system are corrected on the basis of these quantities, whereby the motor control system is approximated to a motor position and speed feedback system. It is therefore possible to prevent interference between the two control systems. Accordingly, it becomes unnecessary to switch over the two servo systems from one to the other.

According to another aspect of the present invention, there is provided an apparatus for controlling a servo system employing a piezo-electric actuator which controls the position of a moving member having mass by controlling the voltage applied to the piezo-electric actuator, wherein the improvement comprises: a device for detecting the position x and acceleration a of the moving member; and a device for effecting control such that the applied voltage E of the piezo-electric actuator is $$E = K_3 \int (r-x)dt - k u v$$

on the basis of a signal v obtained by inputting a signal representative of the acceleration a to a first-order lag circuit, a position command r, and gain constants $K_3$, $K_4$.

According to the above-described arrangement, the position and acceleration of the moving member are detected and the detected acceleration is fed back to the piezo-electric actuator after it has been integrated near the natural frequency $f_r$ of a mechanical vibration system which consists of the piezo-electric actuator as a spring system and the moving member as mass. Accordingly, it is possible to realize a control whereby the damping of the mechanical vibration system is enhanced, and therefore it is possible to stabilize the vibration system. It is also possible to set the gain of the position control loop at a high level. Thus, it is possible to quicken the response of the position control system, increase the degree of precision and also promptly damp oscillations caused externally.

DESCRIPTION OF PREFERRED EMBODIMENTS

Figure 11:
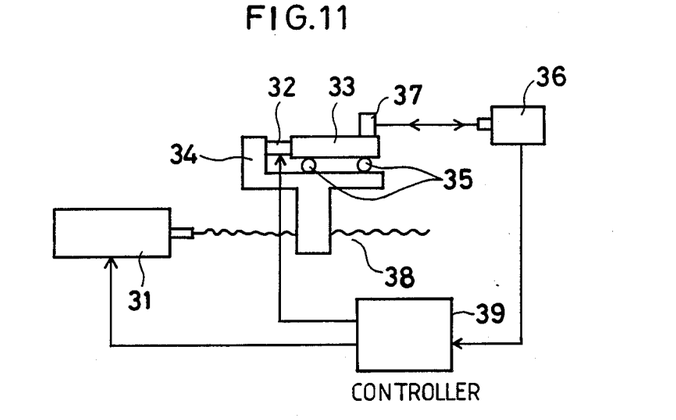
FIG. 11 shows the arrangement of one embodiment of the system for controlling a piezo-electric actuator double servo system according to the present invention.
Figure 12:
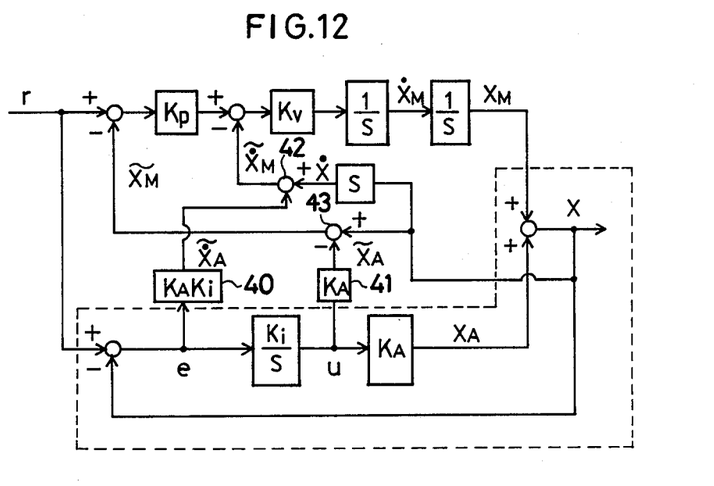
FIG. 12 is a block diagram of the control circuit of the system shown in FIG. 11.

Referring to FIGS. 11 to 13, the reference numeral 31 denotes a motor, 32 a piezo-electric actuator, 33 and 34 moving members, 35 a slide mechanism, 36 a laser distance measuring equipment, 37 a corner cube, 38 a ball screw, 39 a controller, 40, 40', 41 and 41' amplifiers, and 42, 42', 43 and 43' subtracters.

In the system for controlling a piezo-electric actuator double servo system according to the present invention, detectors such as a tachometer generator and a rotational angle detector for the motor are removed from the conventional arrangement shown in FIG. 1, and two servo systems are feedback-controlled using the laser distance measuring equipment 36 alone, as shown in FIG. 11. In the controller 39, the position feedback signal concerning the motor 31 is corrected on the basis of the output of the integral control system for the piezo-electric actuator 32 and the speed feedback signal concerning the motor 31 is corrected on the basis of the input to the integral control system for the piezo-electric actuator 32. FIG. 12 is a block diagram of a specific control circuit of the system shown in FIG. 11.

The principle of the present invention which enables the two servo systems to be simultaneously activated without any dynamic interference therebetween will next be explained with reference to FIG. 12.

In FIG. 12, the portion surrounded with the chain line is the piezo-electric actuator control system, and the reference symbol r denotes the position command, e the deviation or error, u the driving voltage, $x_A$ the displacement of the piezo-electric actuator, $x_M$ the position of the motor, x the position of the moving member, $K_i$ the integral gain, and $K_A$ the constant of the piezo-electric actuator. Since the piezo-electric actuator has proportionality and also hysteresis, it is subjected to integral control, as illustrated.

In the piezo-electric actuator control system shown in the block diagram of FIG. 12, the following relations hold:

$$x_A = K_a u$$

$$\dot{x}_A = K_A K_i e \qquad (1)$$

Hence, $$x_M = x - k_A u$$

$$\dot{x}_M = \dot{x} - k_A k_i e \qquad (2)$$

In the above-described equation (2), u, e are quantities of state inside the piezo-electric actuator control system, $k_A$, $k_i$ are known constants, and x, $\dot{x}$ are quantities of state which can be obtained from the position detector; therefore, all the terms on the right-hand side are known. Thus, it is possible to obtain $x_M$ and $\dot{x}_M$ on the left-hand side. Here, $x_M$ and $\dot{x}_M$ are the position and speed of the motor, and therefore, if the feedback system is formed with these quantities of state, the motor control system and the piezoelectric actuator control system become independent of each other. In consequence, it is possible to eliminate the interference between the two control systems which has heretofore been a problem in the conventional double servo system, and therefore obtain desired characteristics.

The control circuit shown in FIG. 12 is arranged such that the correction expressed by the equation (2) is made with respect to the arrangement shown in FIG. 5 by means of the amplifiers 40, 41 and the subtracters 42, 43. More specifically, the position feedback signal $\widetilde{x_M}$ concerning the motor 31 is defined by a quantity obtained in such a manner that a quantity which is obtained by multiplying the driving voltage u of the piezo-electric actuator by the constant $K_A$ is subtracted from the position x of the moving member 33, whereas the speed feedback signal $\dot{\widetilde{x}}_M$ concerning the motor 31 is defined by a quantity obtained in such a manner that a quantity which is obtained by multiplying the error e by the constants $K_A$ and $K_i$ is subtracted from a speed $\dot{x}$ obtained by, for example, passing the position x through a differentiator. In other words, a feedback system which employs only the position x of the moving member 33 is constituted.

FIG. 13 shows examples of analog circuits for forming the feedback signals $\widetilde{x_M}$ and $\dot{\widetilde{x}}_M$.

Figure 13A:
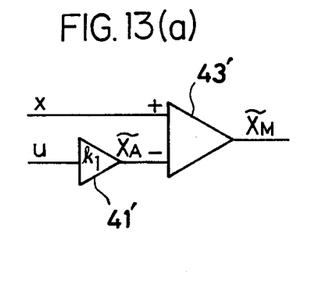
FIG. 13 shows examples of the arrangement of the signal computing circuit.
Figure 13B:
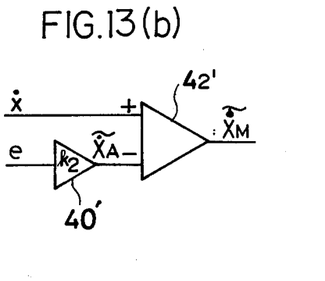

FIG. 13(a) shows one example of an analog circuit for forming a signal representative of the motor position $\widetilde{x_M}$. The reference numeral 41' denotes an amplifier having a gain $k_1$. The output $\widetilde{x_A}$ of the amplifier 41' is equivalent to the displacement of the piezo-electric actuator. The numeral 43' denotes a subtracter the output of which represents the motor position $\widetilde{x_M}$. FIG. 13(b) shows one example of an analog circuit for forming a signal representative of the motor speed $\dot{\widetilde{x}}_M$. The numeral 40' denotes an amplifier having a gain $k_2$, and the $\dot{\widetilde{x}}_A$ the amplifier 40' is equivalent to the speed of the piezo-electric actuator. The numeral 42' denotes a subtracter the output of which represents the motor speed $\dot{\widetilde{x}}_M$.

It should be noted that the present invention is not necessarily limited to the above-described embodiment and various changes and modifications may be imparted thereto. For example, although in the described embodiment the motor position and speed signals are analog signals, the position and speed of the motor may, of course, be processed using digital signals. In general, there are limitations on the displacement of piezo-electric actuators and therefore the displacement thereof may reach a limit value $\pm x_A$ MAX. In such a case, however, it suffices to set the position and speed correction values concerning the piezo-electric actuator at the displacement limit value and zero, respectively (i.e. $\pm \widetilde{x_A}$ MAX and $\widetilde{x_A} = 0$).

As will be clear from the foregoing description, it is possible according to the present invention to eliminate the interference between the two servo systems in positioning carried out by the double servo system and hence form a feedback control sytem using a single position detector. It is therefore possible to activate the two servo systems simultaneously. Accordingly, it becomes unnecessary to switch over the two servo systems from one to the other, and this enables response to be quickened. Thus, it is possible to apply double servo systems to a wide range of position control purposes, for example, contouring control and the like, in which high resolving power and high speed are demanded and to which double servo systems have heretofore been impossible to apply. Further, since it is unnecessary to detect the position and speed of the motor which have heretofore been needed in piezo-electric actuator double servo systems, the production cost is lowered and it is possible to save the installation space and reduce the size of the control system. In the system that employs a combination of a linear motor and a piezo electric actuator also, it is unnecessary to provide a linear scale for forming a feedback signal for the linear motor. Accordingly, designing of the mechanism is considerably facilitated, and it is also possible to reduce the size of the system and increase the degree of precision.

The following is a description of one embodiment of the control apparatus in which a feedback system is formed using a piezo-electric actuator to realize fast response and high precision.

Figure 14:
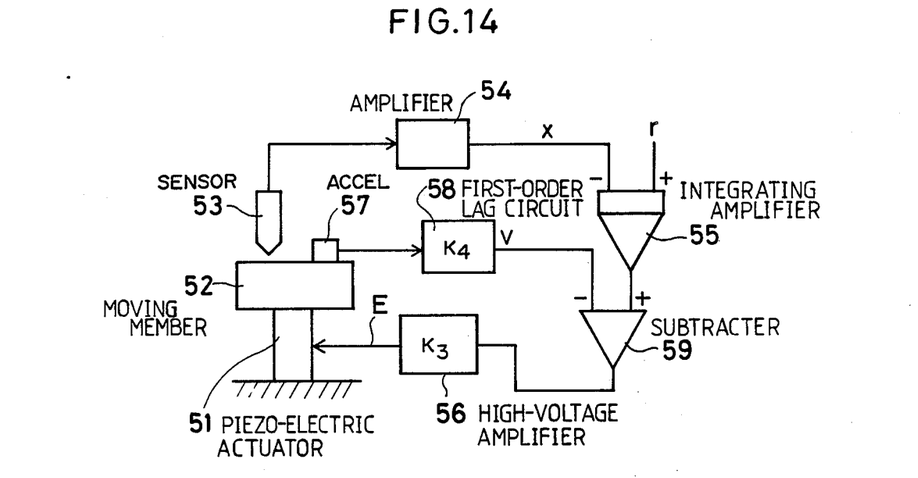
FIG. 14 is a view employed to describe one embodiment of the system for controlling a position control system employing a piezo-electric actuator according to the present invention.

Referring to FIG. 14, the reference numeral 51 denotes a piezo-electric actuator, 52 a moving member, 53 a position sensor, 54 an amplifier, 55 an integrating amplifier, 56 a high-voltage amplifier, 57 an accelerometer, 58 a first-order lag circuit, 59 a subtracter, r the position command, x position, and E the piezo electric actuator driving voltage.

Figure 15:
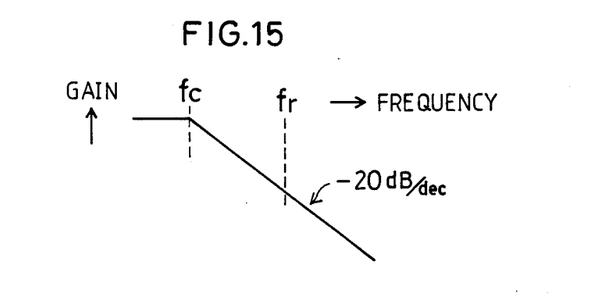
FIG. 15 shows the gain characteristics of the first-order lag circuit.

As will be clear from the comparison between the position control system shown in FIG. 14 and the conventional position control system shown in FIG. 7, the apparatus for controlling a position control system employing a piezo-electric actuator according to the present invention is additionally provided with the accelerometer 57, the first-order lag circuit 58 and the subtracter 59. The accelerometer 57 measures the acceleration of the moving member 52 in the direction parallel to that of the displacement of the piezo-electric actuator 51, the accelerometer 57 being installed on the moving member 52. The first-order lag circuit 58 integrates the acceleration measured by the accelerometer 57. The first-order lag circuit 58 has gain characteristics such as those shown in FIG. 15. More specifically, the gain characteristic curve of the first-order lag circuit 58 shows an integral characteristic at the frequency $f_r$, that is, it has an inclination of $-20$ dB/dec. Here, the frequency $f_r$ is the natural frequency of a mechanical vibration system which consists of the piezo-electric actuator 51 as a spring system and the moving member 52 as mass. The frequency $f_r$ may be expressed as follows:

$$f_r = \frac{1}{2\pi} \sqrt{K_p/M}$$

where $K_p$ is the spring constant and M is mass. The subtracter 59 subtracts the output v of the first-order lag circuit 58 from the output of the integrator 55, thereby setting the driving voltage E of the piezo-electric actuator 51 as follows:

$$E = K_3 \int (r-x)dx - K_4 v$$

where $K_3$ and $K_4$ are gain constants.

As described above, the apparatus for controlling a position control system employing a piezo-electric actuator according to the present invention is arranged such that the position x and acceleration a of the moving member 52 are detected by means of the position sensor 53 and the accelerometer 57, respectively, and the acceleration a is integrated in the first-order lag circuit 58 to obtain a signal v, thereby forming a piezo-electric actuator driving signal E. Thus, it is possible to effect control such that the oscillation of the mechanical vibration system is damped quickly, and it is therefore possible to stabilize the mechanical vibration system. As a result, it is possible to set the gain of the position control loop at a high level.

Figure 16:
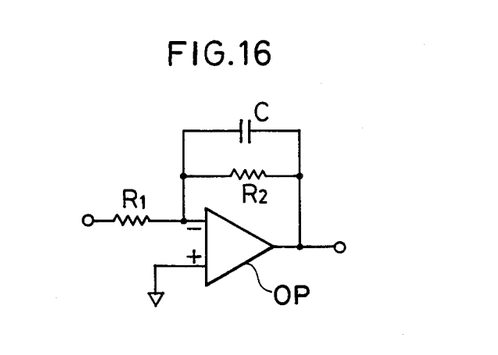
FIG. 16 shows one example in which the first-order lag circuit is composed of an operational amplifier.

FIG. 16 shows one example of the first-order lag circuit 58 in which an operational amplifier OP is employed to constitute the circuit 58. The first-order lag circuit 58 is so designed that the cut-off frequency $f_c = \frac{1}{2}R_2C$ is smaller than the natural frequency $f_r$ of the mechanical vibration system, i.e., $f_c < f_r$, as shown in FIG. 15.

In general, the stroke of the piezo-electric actuator is several $\mu$m, and therefore it is difficult to detect its speed directly. For this reason, it is practical to measure the acceleration of the moving member with an accelerometer and integrate the measured acceleration to obtain the speed of the piezo-electric actuator. Since the damping action is only required to be effective in the frequency band near the natural frequency $f_r = \omega_n/2\pi$ of the vibration system, it is possible to employ a first-order lag circuit having an integral characteristic near the natural frequency $f_r$. To prevent oscillation in a higher-order oscillation mode than the natural frequency $f_r$ and to increase the stability in the low-frequency band, it may be effective practice to connect in series to the first-order lag circuit a band-pass filter the center frequency of which is equal to the natural frequency $f_r$ or a high-pass filter the characteristic curve of which is flat at the natural frequency $f_r$.

Figure 17:
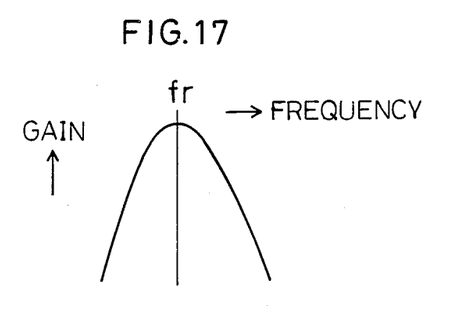
FIG. 17 shows the gain characteristics of a band-pass filter having a central frequency $f_r$.
Figure 18:
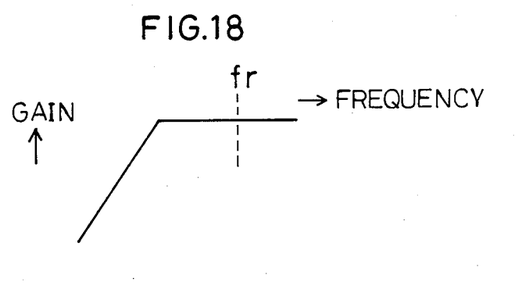
FIG. 18 shows the gain charactersitics of a high-pass filter whose characteristic curve is flat at the frequency $f_r$.

FIG. 17 shows the gain characteristics of a band-pass filter having a central frequency equal to $f_r$, while FIG. 18 shows the gain characteristics of a high-pass filter whose gain characteristic curve is flat at the frequency $f_r$. Filters having such characteristics can be readily realized using commercially available ICs for filters.

The following is consideration of the apparatus for controlling a position control system employing a piezo-electric actuator according to the present invention on the basis of a position control system having a conventional basic arrangement.

Figure 19:
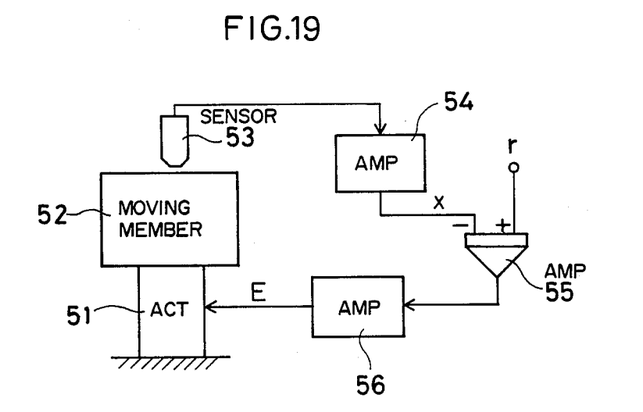
FIG. 19 shows the basic arrangement of a conventional closed-loop position control system employing a piezo-electric actuator.

In FIG. 19, the same reference numerals as those shown in FIG. 14 denote the same constituent elements. The position control system shown in FIG. 19 has substantially the same arrangement as that of the conventional position control system shown in FIG. 7, and that portion of the system which includes the piezo-electric actuator 51 and the moving member 52 may be approximately expressed by the dynamic model shown in FIG. 20, in which M is the mass of the moving member, $f_p$ is the force generated by the piezoelectric actuator (the force being approximately proportional to the applied voltage E), x is the position.

Figure 20:
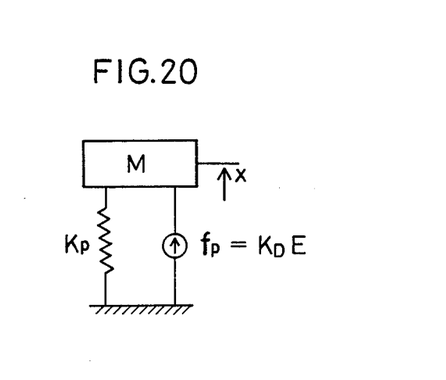
FIG. 20 shows a dynamic model of that portion of the control system, which includes the piezo-electric actuator and the moving member.

The differential equation of this system is as follows:

$$M\ddot{x} + K_p x = f_p \quad (3)$$

If equation (3) is rearranged by substituting $\omega_n^2 = K_p/M$ thereinto, the following equation is obtained:

$$\ddot{x} + \omega_n^2 x = f_p/M \quad (4)$$

The system expressed by equation (4) is a non-damping vibration system and therefore inappropriate for being used to constitute a closed-loop system. Although damping occurs inside the piezo-electric actuator, it is, in actual practice, so small that it can be ignored. Therefore, the damping capacity is enhanced by effecting control as follows:

$$f_p = -g\dot{x} \quad (5)$$

If equation (4) is rearranged by substituting equation (5) thereinto, the following equation is obtained:

$$\ddot{x} + \frac{g}{M}\dot{x} + \omega_n^2 x = 0 \quad (6)$$

Thus, a secondary vibration system having damping capacity is obtained. Accordingly, if the desired damping constant is $\xi$, $2\xi\omega_n = g/M$; therefore, it suffices to satisfy the following equation:

$$g = 2\xi\omega_n \cdot M \quad (7)$$

Figure 21:
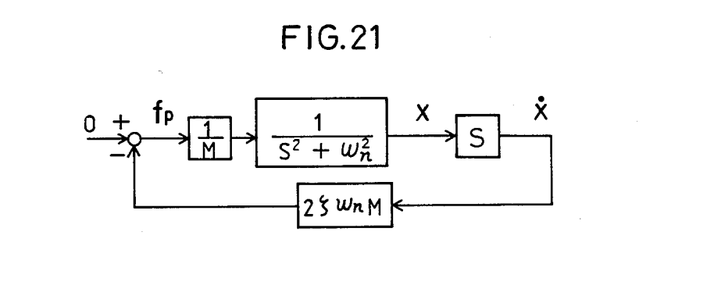
FIG. 21 is a block diagram of the speed feedback loop.

The above-described relation may be expressed by a block diagram as shown in FIG. 21. Since the feedback control expressed by equation (5) is merely effective in enhancing the damping capacity of the vibration system, it is necessary to separately form a control system for the purpose of position control.

The position control system expressed by equation (3) is a proportionality system having an equilibrium point expressed as follows:

$$x = f_p/K_p \quad (8)$$

Therefore, integral control must be incorporated in order to form a closed-loop system having no offset. This integral control is effected as follows:

$$f_p = K_i \int (r-x)dt \quad (9)$$

Accordingly, to effect the integral control and the damping enhancing control simultaneously, it suffices to effect a feedback control expressed by the following equation which is obtained from the above-described equations (5) and (9):

$$f_p = K_i \int (r-x)dt - 2\xi\omega_n M\dot{x} \qquad (10)$$

Figure 22:
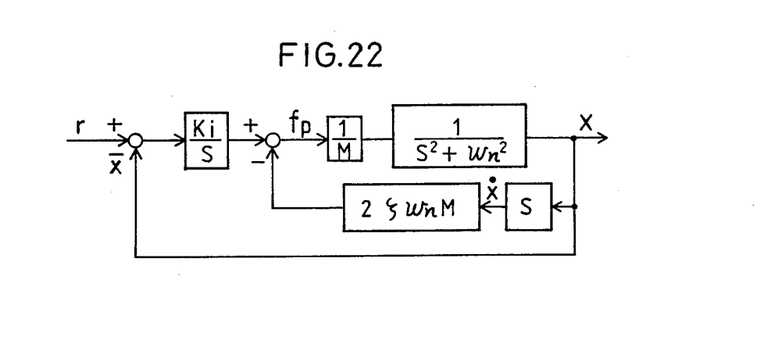
FIG. 22 is a block diagram of the speed feedback loop shown in FIG. 21 to which a feedback loop for integral control is added.
Figure 23:
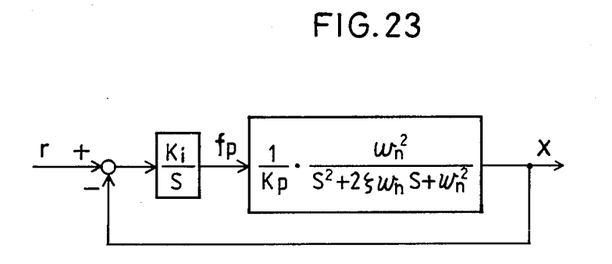
FIG. 23 is a block diagram of a system having a simplified speed feedback loop.

FIG. 22 is a block diagram of a position control system which effects the feedback control expressed by equation (10), and FIG. 23 shows a position control system in which the speed feedback loop is simplified.

Figure 24:
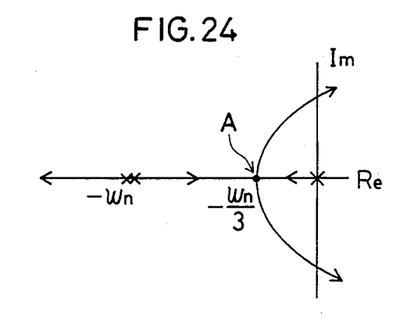
FIG. 24 shows the root locus plotted when the gain $K_i$ is employed as a parameter under the condition of $\xi=1$.
Figure 25:
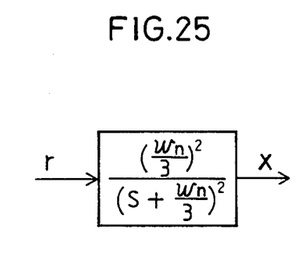
FIG. 25 shows the transfer function between the position command and the position.

In the system shown in FIG. 23, when $\xi=1$, the loop gain at the stability limit can be maximized and the fastest response can be obtained. FIG. 24 shows the root locus plotted when the gain $K_i$ is employed as a parameter under the condition of $\xi=1$. In this case, if the gain $K_i$ is set so as to satisfy the condition that the characteristic equation has a multiple root such as that shown by the point A in FIG. 24, that is:

$$K_i = \frac{4}{27} K_p \omega_n$$

then, the transfer function G(s) of r−x is set as shown in FIG. 25, that is:

$$G(s) = \frac{\left(\frac{\omega_n}{3}\right)^2}{\left(S + \frac{\omega_n}{3}\right)^2}$$

This setting enables the fastest response to be obtained under the condition that the position loop is non-oscillatory. It is generally preferable that the position loop be non-oscillatory. In particular, in machining processes wherein workpieces are machined by removing the unnecessary part therefrom, for example, cutting, grinding and the like, it is essential that the position loop be non-oscillatory. In the control system according to the present invention which is expressed by equation (10), feedback control which effects a damping action proportional to x is constantly carried out, and it is therefore possible to promptly damp also oscillations caused externally.

As will be clear from the foregoing description, according to the present invention, not only the integrated value of the error e=r−x but also the integrated value of the acceleration are fed back with respect to the position control system employing a piezo-electric actuator. Therefore, the vibration characteristics are stabilized and, as a result, the integration gain can be increased. Thus, it is possible to form a position control system which is faster in response and higher in the degree of precision than the conventional ones. Further, since it is possible to obtain non-oscillatory response of the position control system which has heretofore been difficult to obtain in the prior art, it becomes possible to employ the position control system for machines in which oscillatory response is forbidden, for example, cutting machines and the like. Thus, the apparatus for controlling a position control system employing a piezoelectric actuator according to the present invention is effectively applied to the field of super-precision machining.

What is claimed is:

1. An apparatus for controlling a piezoelectric actuator double servo system in which a first servo system which feeds back at least a position signal and a speed signal and a second servo system which effects integral control by feeding back position are connected in series, said two servo systems having a mutual feedback control system employing a single position detector, said apparatus comprising:
   first means for adding a feedback displacement signal obtained by multiplying an output of an integral controller of said second servo system by a first gain, which is smaller than zero, to the position feedback signal of said first servo system; and
   second means for adding a feedback speed signal obtained by multiplying an input of the integral controller of said second servo system by a second gain which is smaller than zero to the speed feedback signal of said first servo system,
   wherein a dynamic interference between said first and second servo systems is eliminated and said two servo systems are activated simultaneously.

2. The control apparatus according to claim 1, wherein, when an absolute value of the output of the integral control system of said second servo system exceeds a saturation value, said first means sets said feedback displacement signal at plus or minus a maximum feedback displacement, and the feedback speed signal is set at zero.

3. An apparatus for controlling a servo system employing a piezo-electric actuator which controls the position of a moving member having mass by controlling the voltage applied to said piezo-electric actuator, wherein the improvement comprises:
   first means for detecting the position and acceleration of the moving member; and
   second means for effecting control such that the applied voltage E of said piezo-electric actuator is $$E = K_3 \int (r-x)dt - K_4 v$$

where v is a signal obtained by inputting a signal representative of the acceleration a to a first-order lag circuit, r is a position command, x is the position, and $K_3$, $K_4$ are gain constants.

4. The control apparatus according to claim 3, wherein said first-order lag circuit has a cut-off frequency which is sufficiently smaller than a natural frequency $f_r$ which is determined by the mass M of said moving member and the spring constant $K_p$ of said piezo-electric actuator as follows:

$$f_r = \frac{1}{2\pi} \sqrt{K_p/M}$$

5. The control apparatus according to claim 3, wherein said first-order lag circuit has a band-pass filter connected thereto in series, the center frequency of said band-pass filter being equal to said natural frequency.

6. The control apparatus according to claim 3, wherein said first-order lag circuit has a high-pass filter connected thereto in series, the characteristic curve of said high-pass filter being flat at said natural frequency.

* * * * *